United States Patent [19]

Toyomaki

[11] 4,300,020

[45] Nov. 10, 1981

[54] METHOD AND APPARATUS FOR ELIMINATING PILOT SIGNAL COMPONENTS FROM STEREO DEMODULATED SIGNALS

[75] Inventor: Kazuya Toyomaki, Yokohama, Japan

[73] Assignee: Victor Company of Japan, Limited, Yokohama, Japan

[21] Appl. No.: 120,096

[22] Filed: Feb. 11, 1980

[30] Foreign Application Priority Data

Feb. 15, 1979 [JP] Japan .................................. 54-16557

[51] Int. Cl.³ .............................................. H04H 5/00
[52] U.S. Cl. .................................. 179/1 GD; 329/50
[58] Field of Search .......... 179/1 GD, 1 GE; 329/50, 329/167

[56] References Cited

U.S. PATENT DOCUMENTS

| 4,047,116 | 9/1977 | Ogita | 179/1 GD |
| 4,069,398 | 1/1978 | Fujie | 179/1 GE |
| 4,076,963 | 2/1978 | Fujie et al. | 179/1 GD |
| 4,164,624 | 8/1979 | Ogita | 179/1 GD |

FOREIGN PATENT DOCUMENTS

54-148401  11/1979  Japan .............................. 179/1 GD

*Primary Examiner*—Douglas W. Olms
*Attorney, Agent, or Firm*—Lowe, King, Price & Becker

[57] ABSTRACT

A pilot signal cancelling signal is first combined with a composite stereo signal by a first predetermined ratio and thus a combined signal is fed to a stereo demodulator (3A) which produces a difference signal and an inverted difference signal, while the same cancelling signal is then combined with the composite stereo signal by a second predetermined ratio so that this combined signal will be used for producing left and right channel output signals by matrixing the difference signal and the inverted difference signal. At least three combiners (35, 39, 40) are utilized to effect the combination of the cancelling signal with the composite stereo signal.

9 Claims, 4 Drawing Figures

METHOD AND APPARATUS FOR ELIMINATING PILOT SIGNAL COMPONENTS FROM STEREO DEMODULATED SIGNALS

FIELD OF THE INVENTION

This invention generally relates to methods and apparatus for stereo multiplex demodulating a composite stereo signal. More particularly, the invention relates to methods and apparatus for eliminating pilot signal components from stereo demodulated signals during demodulating.

BACKGROUND OF THE INVENTION

As is well known, in an FM (frequency modultion) stereo receiver, a composite stereo signal which includes a pilot signal of 19 Hz, a main signal indicative of the sum of the left and right channel signals, and a sub signal indicative of the difference between the left and right channel signals, where the sub carrier of 38 Kz is suppressed, is first detected and then the detected composite stereo signal is fed to a stereo multiplex demodulator or decoder to extract the left and right channel signals from the composite stereo signal respectively. The pilot signal of 19 Hz is essential for obtaining a difference signal (L-R) and an inverted difference signal (R-L) by demodulating the sub signal. However, the pilot signal is unnecessary after the left and right channel signals are obtained. Namely, if the detected left and right channel signals include pilot signal components, i.e. the pilot signal and its harmonics, these pilot signal components have to be eliminated from the demodulated left and right channel signals by means of a suitable low pass filter. Provision of such a low pass filter may deteriorate the frequency response characteristic of the demodulated signals.

For the above reason, in a conventional stereo multiplex demodulator, a pilot signal cancelling signal is first produced and the pilot signal components included in the composite stereo signal is negated or cancelled by the cancelling signal during demodulation. As will be described in detail hereinlater, when a pilot signal cancelling signal is used to eliminate the pilot signal components in a conventional manner, the pilot signal components included in the demodulated left and right channel signals cannot be sufficiently eliminated to a practical level. Therefore, in a conventional stereo multiplex demodulating system, a low pass filter has to be employed to further reduce the pilot signal components. When such a low pass filter is used, the flatness of the frequency characteristics as to the high frequency components of the demodulated signals is apt to be deteriorated. For this reason, the degree of the pilot signal components elimination or elimination ratio cannot be set large enough. In order to solve this problem, it is theoretically possible to employ a resonance circuit consisting of a coil and a capacitor for producing a pilot signal cancelling signal which hardly includes harmonic components thereby obtaining high degree of elimination of the pilot signal components. However, this countermeasure has drawbacks as follows: Namely, the coil included in the resonance circuit is apt to induce inductive noises, while the phase of the cancelling signal tends to vary due to the variations of the constants of the coil and the capacitor. As the phase of the cancelling signal deviates from a given point, the degree of elimination drops resulting in the unstability of the pilot signal components elimination.

Furthermore, a coil occupies a relatively large space so that the stereo multiplex demodulator including such a resonance circuit tends to be bulky although remaining elements can be included in an integrated circuit. Consequently, the above mentioned theoretically possible measure cannot be adopted.

SUMMARY OF THE INVENTION

The present invention has been achieved in order to remove the above described drawbacks and disadvantages inherent to the conventional methods and apparatus for eliminating pilot signal components during stereo demodulating.

It is, therefore, a primary object of the present invention to provide new and useful methods and apparatus for eliminating pilot signal components from stereo demodulated signals in which the pilot signal components are almost perfectly cancelled.

Another object of the present invention is to provide methods and apparatus for eliminating pilot signal components from stereo demodulated signals in which the degree of elimination can be made remarkably higher than that in conventional methods and apparatus.

A further object of the present invention is to provide methods and apparatus for eliminating pilot signal components from stereo demodulated signals in which the frequency characteristic of the demodulated signals is not deteriorated.

A still further object of the present invention is to provide methods and apparatus for eliminating pilot signal components from stereo demodulated signals in which the stereo multiplex demodulator does not occupy a large space.

A yet further object of the present invention is to provide methods and apparatus for eliminating pilot signal components from stereo demodulated signals in which the operation of the stereo multiplex demodulator is stable.

In order to achieve the above mentioned objects, the pilot signal cancelling signal is first combined with the composite stereo signal by a first predetermined ratio and thus a combined signal is fed to a stereo demodulator which produces a difference signal (L-R) and an inverted difference signal (R-L), while the same cancelling signal is then combined with the composite stereo signal by a second predetermined ratio so that this combined signal will be used for producing left and right channel output signals by matrixing the difference signal (L-R) and the inverted difference signal (R-L).

In accordance with the present invention there is provided a method of eliminating pilot signal components from stereo demodulated left and right channel signals by means of a pilot signal cancelling signal, the stereo demodulated left and right channel signals being obtained by matrixing a difference signal indicative of the difference between the left and right channel signals and an inverted difference signal which corresponds to an inverted signal of the difference signal, with respect to a composite stereo signal which includes the pilot signal, a main signal indicative of the sum of the left and right channel signals, and a sub signal indicative of the difference between the left and right channel signals, the difference signal and the inverted difference signal are respectively obtained by multiplying the composite stereo signal by a stereo demodulating signal, comprising the steps of: (a) combining the pilot signal cancelling signal with the composite stereo signal by a first predetermined ratio for producing a first combined composite stereo signal, the first combined composite stereo signal being used to produce the difference signal and the inverted difference signal; and (b) combining the pilot signal cancelling signal with the composite stereo signal by a second predetermined ratio for producing a second combined composite stereo signal, the second combined composite stereo signal being used for matrixing the difference signal and the inverted difference signal for producing the left and right channels signals.

In accordance with the present invention, there is further provided a stereo multiplex demodulator for producing left and right channel output signals from a composite stereo signal which includes a pilot signal, a main signal indicative of the sum of the left and right channel signals, and a sub signal indicative of the difference between the left and right channel signals, comprising: (a) a stereo demodulaint signal generator for producing a stereo demodulating signal the frequency of which equals twice the frequency of the pilot signal; (b) a pilot signal cancelling signal generator for producing a pilot signal cancelling signal having an amplitude proportional to the amplitude of the pilot signal, a frequency synchronous with the pilot signal, and a phase the same or opposite with respect to the phase of the pilot signal; (c) first means for combining the composite stereo signal with the cancelling signal by a first predetermined ratio for producing a first combined composite stereo signal; (d) a stereo demodulator responsive to the first combined composite stereo signal and to the stereo demodulating signal for producing a difference signal indicative of the difference between the left and right channel signals and an inverted difference signal corresponding to an inverted signal of the difference signal; (e) second means for combining the composite stereo signal with the cancelling signal by a second predetermined ratio for producing a second combined composite stereo signal; (f) third means for combining the second combined composite stereo signal with the difference signal for producing the left channel signal; and (g) fourth means for combining the second combined composite stereo signal with the inverted difference signal for producing the right channel signal.

BRIEF DESCRIPTION OF THE DRAWINGS

These and other objects and features of the present invention will become more readily apparent from the following detaild description of the preferred embodiments taken in conjunction with the accompanying drawings in which.

DETAILED DESCRIPTION OF THE PREFERRED EMBODIMENTS

Prior to describing the preferred embodiments of the present invention, conventional method and apparatus for cancelling or eliminating pilot signal components will be described with reference to FIG. 1.

Figure 1:
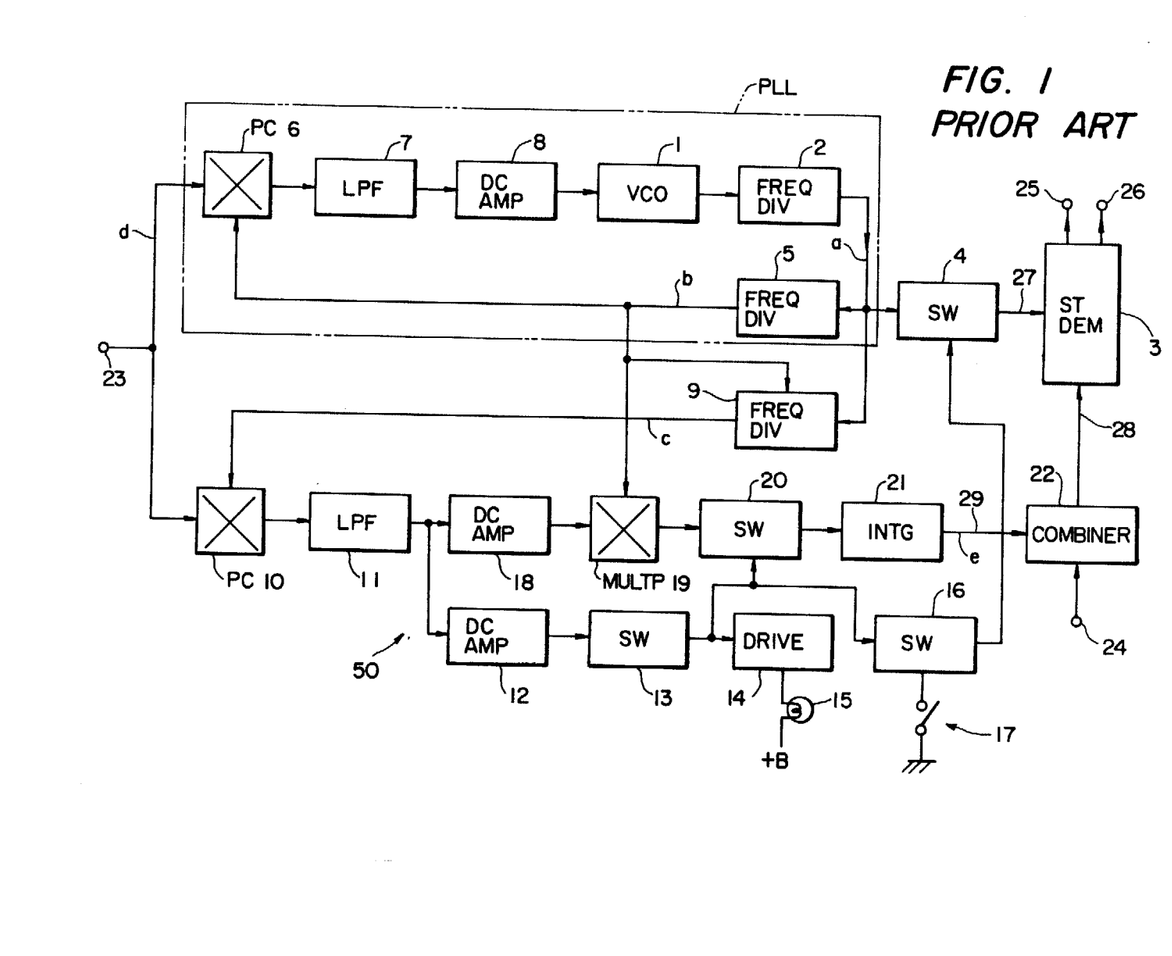
FIG. 1 is a schematic block diagram of a conventional stereo multiplex demodulator in which a cancelling signal is produced and is then combined with a composite stereo signal in a conventional manner.

FIG. 1 is a schematic block diagram of a conventional stereo multiplex demodulator in which circuits for cancelling pilot signal components are used. The stereo multiplex demodulator of FIG. 1 comprises a phase locked loop (PLL) responsive to a composite stereo signal for producing stereo demodulating or decoding signal, a stereo demodulator 3, a cancelling signal producing circuit 50 and a combiner 22. Between the PLL and the stereo demodulator 3, a stereo-disable switch 4 is provided. The PLL which includes various circuits is enclosed by a dot-dash line.

Figure 2:
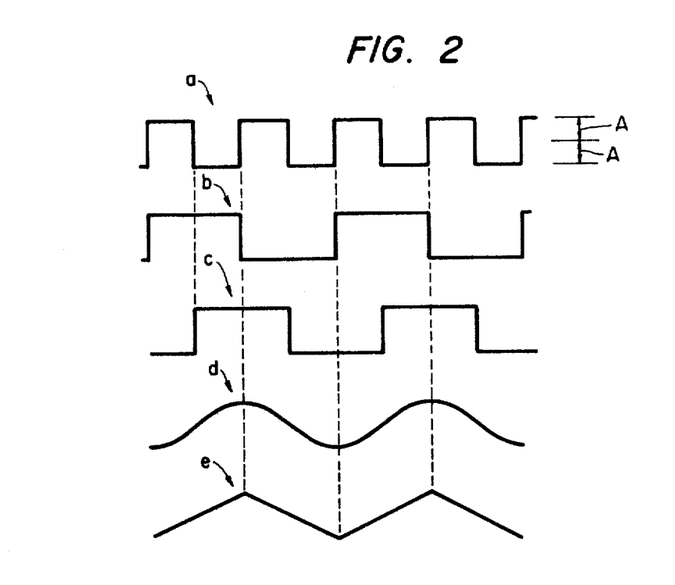
FIG. 2 is a waveform diagram showing various waveforms used in the circuitry of FIG. 1.

The PLL circuit, which functions as a stereo demodulating signal generator, comprises a controllable oscillator 1, first and second divided-by-two frequency dividers 2 and 5, a phase comparator 6, a low pass filter 7 and a D.C. amplifier 8. The operation of the PLL will be described with reference to a waveform diagram of FIG. 2. An input terminal 23 is provided for receiving a composite stereo signal including a pilot signal of 19 KHz the waveform of which is shown in FIG. 2 and is designated as "d". The phase comparator 6, the low pass filter 7, the D.C. amplifier 8, the controllable oscillator, such as a voltage or current controlled oscillator, a first frequency divider 2, and a second frequency divider 5 are connected in series, and an output terminal of the second frequency divider 5 is connected to an input terminal of the phase comparator 6 to make a loop. The second frequency divider 5 produces an output signal "b" having a phase different from that of the pilot signal "d" by 90 degrees, and the output signal "b" is fed to the phase comparator 6 as a comparison signal. The first frequency divider 2 produces a stereo demodulating signal "a" of 38 KHz having a predetermined phase relationship with respect to the pilot signal "d". The above described operation of the PLL is made on the assumption that the loop is in a locked condition.

The stereo demodulating signal "a" produced by the PLL circuit is then fed via the stereo-disable switch 4 and a conductor 27 to the stereo demodulator 3. The stereo demodulating signal is a rectangular or square wave signal having a duty cycle of 50 percent as shown in FIG. 2. This stereo demodulating signal "a" will be mathematically expressed as follows:

$$\frac{4A}{\pi}\left( \sin\omega_{38}t + \frac{1}{3}\sin\omega_{38}t + \frac{1}{5}\sin\omega_{38}t + \ldots \right) \quad (1)$$

wherein

A indicates the amplitude of the stereo demodulating signal "a" (peak to peak amplitude equals 2A); and $\omega_{38}$ is the fundamental angular frequency of the stereo demodulating signal "a":

A reference numeral 9 indicates a third divided-by-two frequency divider which divides the frequency of the output signal "a" of the first frequency divider 2 by two using the output signal "b" of the second frequency divider 5 as a synchronous signal. The third frequency divider 9 produces an output signal "c" in the form of a square wave signal, and its phase is deviated from that of the output signal of the second frequency divider 5 by 90 degrees, while the duty cycle of the square wave signal "c" is 50 percent and its fundamental frequency is 19 KHz.

A reference numeral 10 designates a phase comparator which is responsive to the composite stereo signal including the pilot signal "d" and to the output signal "c" of the third frequency divider 9. The composite stereo signal "d" is multiplied by the signal "c" from the third frequency divider 9 in the phase comparator 10, and an output signal indicative of the product of the multiplication of the phase comparator 10 is fed to a low pass filter 11 which removes high frequency components from the product signal. The output signal of the low pass filter 11 is applied to an input terminal of first and and second D.C. amplifiers 12 and 18.

An output signal of the first D.C. amplifier 12 is then applied to an input terminal of a switching circuit 13 which has a hysterisis characteristic. The switching circuit 13 produces its output signal by detecting its input signal, and the output signal of the switching circuit 13 will be used to control a stereo indicator driving circuit 14 which drives a stereo indicator lamp 15, and to control the stereo-disable switch 4 as will be described hereinbelow.

A reference numeral 16 designates a monaural only control switch which is responsive to the output signal of the switching circuit 13 and another signal from a manual swich 17. The monaural only control switch 16 has a function that stereophonic reproduction is prevented although a stereo broadcast signal is received by the FM stereophonic receiver, and when it is intended to prevent stereo demodulation, the manual switch 17 may be manipulated.

When the PLL is in a locked condition, the output signal "c" of the third frequency divider 9 has the same or opposite phase with respect to the pilot signal "d" as shown in FIG. 2. This means that the multiplication of the pilot signal "d" by the signal "c" is regarded as synchronous detection of the pilot signal "d". Therefore, the amplitude of the D.C. signal obtained at the output terminal of the low pass filter 11 which is responsive to the product signal from the phase comparator 10, is proportional to the amplitude of the pilot signal "d". The switching circuit 13 produces an output signal by comparing the amplitude of the output D.C. signal of the first D.C. amplifier 12 with a predetermined threshold, and the control of the stereo disable switch 4 is performed by the output signal of the switching circuit 13.

On the other hand, the low pass filter 11 output signal proportional to the amplitude of the pilot signal "d" is applied after amplified by the second D.C. amplifier 18 to an input terminal of a multiplier 19 which has another input terminal for receiving the output signal "b" of the second frequency divider 5. Accordingly, the output signal of the second D.C. amplifier 18 is multiplied by the signal "b" from the second frequency divider 5 so that the multiplier 19 produces an output square wave signal the waveform of which is the same as that of the signal "b", having an amplitude proportional to the amplitude of the pilot signal "d", a duty cycle of 50 percent and a frequency of 19 KHz.

The output signal indicative of the product of the multiplication by the multiplier 19 is applied via a switch 20, which functions in the same manner as the stereo-disable switch to disable the cancelling operation of the pilot signal, to an input terminal of an integrator 21 so that the product signal from the multiplier 19 is integrated.

The output signal of the integrator 21 is a triangular wave signal "e" as shown in FIG. 2, and the amplitude of the signal "e" is proportional to the amplitude of the pilot signal, while the phase of the signal "e" is the same or opposite with respect to that of the pilot signal "d", and the frequency of the signal "e" is 19 KHz. This signal "e" will be used as a pilot cancelling or negating signal and is applied to the combiner 22 which receives the composite stereo signal including the pilot signal "d". The cancelling signal "e" applied to the combiner 22 is combined with the composite stereo signal applied to the same via an input terminal 24 and thus a resultant output signal is obtained at an output terminal of the combiner 22. The output signal of the combiner 22 is fed to an input terminal of the stereo demodulator portion 3 via a conductor 28.

The demodulator portion 3 produces left and right channel audio signals by various operations, such as the multiplication of the composite stereo signal by the stereo demodulating signal applied via the conductor 27 and the matrixing a difference signal and an inverted difference signal which are obtained as the result of the multiplication by using a main signal included in the composite stereo signal. The left and right channel audio signals are respectively developed at the first and second output terminals 25 and 26.

In the above described conventional circuitry, the output left and right channel audio signals developed at the output terminals 25 and 26 do not include the pilot signal components since the composite stereo signal applied to the input terminal 24 is combined with the cancelling signal "e" in the combiner 22.

As is well known, the composite stereo signal includes a main signal which corresponds to the sum (L+R) of the left and right channel signals, a sub signal which consists of an amplitude modulated suppressed carrier wave obtained by amplitude modulating a carrier wave of $2\omega_p$ (wherein $\omega_p$ is the angular frequency of the pilot signal "d") by a difference signal (L-R) indicative of the difference between the left and right channel signals L and R, and the pilot signal "d". It is assumed that the composite stereo signal, which is expressed in terms of C(t), is mathematically expressed by the following equation (2):

$$C(t) = L + R + P \sin \omega_p t + (L - R) \sin 2\omega_p t \qquad (2)$$

wherein P is the amplitude of the pilot signal "d":

The cancellation degree of the pilot signal "d" in the conventional stereo multiplex demodulator of FIG. 1 will be described hereinbelow. Although the stereo demodulating signal applied via the conductor 27 to the demodulator portion 3 is expressed by the above mentioned formula (1), the stereo demodulating signal will be further expressed in connection with the left channel side stereo demodulating signal $D_L(t)$ and the right channel side stereo demodulating signal $D_R(t)$ if we consider the total system of the demodulator in which matrixing is performed for maximizing the degree of the left-right separation in addition to the multiplication of the composite stereo signal by the stereo demodulating signal which is done for obtaining the difference signal (L−R) and the inverted difference signal (R−L). The left channel side stereo demodulating signal $D_L(t)$ and the right channel side stereo demodulating signal $D_R(t)$ are as follows:

$$D_L(t) = M\left\{ \tfrac{1}{2} + \left( \sin 2\omega_p t + \tfrac{1}{3}\sin 6\omega_p t + \tfrac{1}{5} \sin 10\omega_p t + \ldots \right) \right\} \qquad (3)$$

$$D_R(t) = M\left\{\frac{1}{2} - \left(\sin 2\omega_p t + \frac{1}{3}\sin 6\omega_p t + \frac{1}{5}\sin 10\omega_p t + \ldots\right)\right\} \quad (4)$$

wherein M is the amplitude of the stereo demodulating signal, namely, M corresponds to the gain of the stereo demodulator:

Assuming that the aforementioned cancelling signal "e" is expressed in terms of E(t), the cancelling signal E(t) will be mathematically expressed by the following equation (5):

$$E(t) = \quad (5)$$
$$PN\left(\sin\omega_p t - \frac{1}{3^2}\sin 3\omega_p t + \frac{1}{5^2}\sin 5\omega_p t - \frac{1}{7^2}\sin 7\omega_p t + \ldots\right)$$

wherein
P is the amplitude of the pilot signal:
N is a factor of proportionality; and
PN indicates an amplitude component proportional to the amplitude of the pilot signal:

If the combining ratio of the cancelling signal E(t) with the composite stereo signal C(t) is expressed in terms of k (k is negative when cancelling signal is in phase with respect to the pilot signal included in the composite stereo signal, and on the other hand, k is positive in case of opposite phase), the output signal S(t) of the combiner 22 will be expressed by the following equation (6):

$$S(t) = C(t) + kE(t) \quad (6)$$

The left channel output signal of the stereo demodulator 3 corresponds to the result of the multiplication of the signal S(t) of equation (6) by the left channels stereo demodulating signal $D_l(t)$. The $\omega_p$ component, which may be expressed in terms of $F_l(t)$, included in the left channel output signal of the demodulator portion 3 will be written by the following equation (7):

$$F_l(t) = \frac{MP}{2}\left[(1 + kN)\sin\omega_p t + \left\{1 + kN\left(1 - \frac{1}{3^2} + \frac{1}{3\times 5^2} - \frac{1}{3\times 7^2} + \ldots\right)\right\} X\cos\omega_p t\right]$$

$$= \frac{MP}{2}\left[(1 + kN)\sin\omega_p t + \left(1 + kN\sum_{n=1}^{\infty}\frac{8}{(4n-3)^2(4n-1)^2}\right)\cos\omega_p t\right]$$

$$= \frac{MP}{2}\sqrt{(1+kN)^2 + \left(1 + kN\sum_{n=1}^{\infty}\frac{8}{(4n-3)^2(4n-1)^2}\right)^2} \sin(\omega_p t + \theta_l)$$

wherein $$\theta_l = \arctan\frac{1 + kN\sum_{n=1}^{\infty}\frac{8}{(4n-3)^2(4n-1)^2}}{1+kN}$$

Therefore, the amplitude $|F_l(t)|$ of the $\omega_p$ component can be expressed by the following equation (8):

$$|F_l(t)| = \quad (8)$$

$$\frac{MP}{2}\sqrt{(1+kN)^2 + \left(1 + kN\sum_{n=1}^{\infty}\frac{8}{(4n-3)^2(4n-1)^2}\right)^2}$$

In the same manner the amplitude $|F_r(t)|$ of the $\omega_p$ component included in the right channel output signal may be obtained. Since the value of $|F_r(t)|$ is the same as that of $|F_l(t)|$, these terms may be written as follows:

$$|F_r(t)| = |F_l(t)| = |F(t)|$$

Let us set the minimum value of $|F(t)|$ as $|F(t)|_{min}$, and $|F(t)|_{min}$ is given by the following equation (10) when the combining ratio k is given by the following equation (9):

$$k = -\frac{1 + \sum_{n=1}^{\infty}\frac{8}{(4n-3)^2(4n-1)^2}}{1 + \left(\sum_{n=1}^{\infty}\frac{8}{(4n-3)^2(4n-1)^2}\right)^2} \cdot \frac{1}{N} \quad (9)$$

$$|F(t)|_{min} = \frac{MP}{2}\sqrt{2 - \frac{\left\{1 + \sum_{n=1}^{\infty}\frac{8}{(4n-3)^2(4n-1)^2}\right\}^2}{1 + \left(\sum_{n=1}^{\infty}\frac{8}{(4n-3)^2(4n-1)^2}\right)^2}} \quad (10)$$

Nextly, in case that the cancellation of the pilot signal is not performed, namely, when k=0, the amplitude $|F(t)|_{k=0}$ of the $\omega_p$ component included in the output signal is given by the following equation (11):

$$|F(t)|_{k=0} = \frac{MP}{2}\sqrt{2} \quad (11)$$

From the above, the maximum degree of the pilot signal cancellation, which is expressed in terms of $q_{max}$, may be given as follows:

$$q_{max} = \frac{|F(t)|_{k=0}}{|F(t)|_{min}} \approx 25.3 \text{ dB} \quad (12)$$

Namely, in the conventional circuitry of FIG. 1, the maximum degree of cancellation of about 25.3 dB is obtained when the combining ratio k is set at the value represented by the equation (9). Accordingly, the level of the $\omega_p$ component of 19 Hz included in the output signal is lower than that in case that cancellation is not effected by 25.3 dB. When converting this value into a value of signal to noise ratio with respect to a modulation signal of 1 Kz, which appears when receiving a stereo broadcast signal, this becomes 56.6 dB including the deemphasis characteristic of 50 microseconds. However, high fidelity reproduction of audio frequencies cannot be expected with such a value of 56.6 dB, and thus it can be said that this value is far from a practical value.

For this reason, as set forth hereinbefore, a low pass filter is needed in a conventional stereo multiplex demodulator for further reducing the 19 KHz component, i.e. the pilot signal component.

Figure 3:
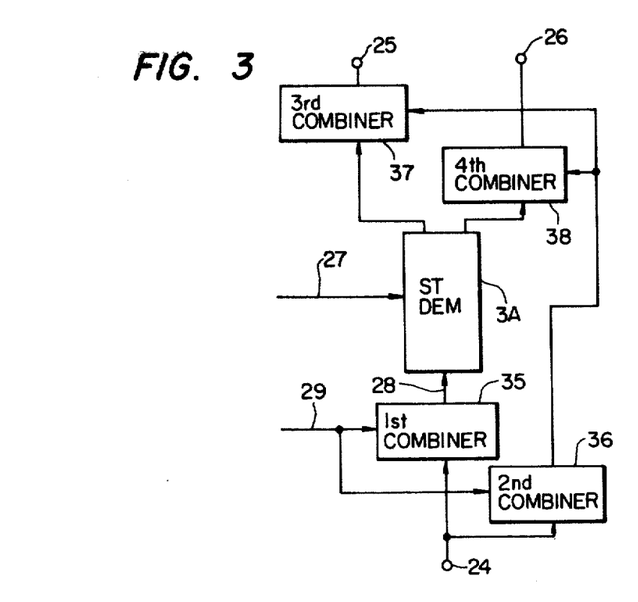
FIG. 3 is a schematic block diagram of a stereo demodulator portion of a stereo multiplex demodulator according to the present invention.

Reference is now made to FIG. 3 which shows a schematic block diagram of a portion of a stereo multiplex demodulator by which the present invention will be readily understood. The circuitry of FIG. 3 corresponds to the combination of the demodulator portion 3 and the combiner 22 both shown in FIG. 1. Namely, the conventional PLL and the cancelling signal generator 50 shown in FIG. 1 may be used for the embodiment of FIG. 3 for supplying the circuitry of FIG. 3 with a stereo demodulating signal and a pilot signal cancelling signal respectively via conductors 27 and 29.

The circuitry of FIG. 3 comprises a stereo demodulator 3A which produces a difference signal (L−R) and an inverted difference signal (R−L) by multiplying the composite stereo signal applied via a conductor 28 and including at least a sub signal, by a stereo demodulating signal applied via a conductor 27, and first to fourth combiners 35, 36, 37 and 38. The first combiner 35 is responsive to the composite stereo signal applied via an input terminal 24, and to a pilot signal cancelling signal applied via the conductor 29. The pilot signal cancelling signal, such as the signal "e" in FIG. 1, is combined with the composite stereo signal by a first predetermined ratio. Namely, the first ratio is determined in view of the ratio of harmonic components included in the cancelling signal and the harmonic components included in the stereo demodulating signal, in such a manner that the fundamental frequency component of the pilot signal will be eliminated from the output signal of the first combiner 35. The second combiner 36 is also responsive to the composite stereo signal applied via the input terminal 24, and to the pilot signal cancelling signal applied via the conductor 29. The pilot signal cancelling signal is combined with the composite stereo signal by a second predetermined ratio. This second ratio is determined in view of the ratio of harmonics included in the pilot signal which is included in the composite stereo signal to harmonics included in the pilot signal cancelling signal, in such a manner that these two different harmonics negate each other.

The first combiner 35 has an output terminal connected to an input terminal of the stereo demodulator 3A so that an output singal indicative of the result of the combination is applied to the stereo demodulator 3A. The second combiner 36 also has an output terminal connected to respective input terminals of the third and fouth combiners 37 and 38 so that the output signal of the second combiner 36 is respectively applied to the third and fouth combiners 37 and 38. Each of the third and fourth combiners 37 and 38 has another input terminal, and thus the third combiner 37 is responsive to the difference signal (L−R) from the stereo demodulator 3A, while the fourth combiner 38 is responsive to the inverted difference signal (R−L) from the stereo demodulator 3A. The third combiner 37, therefore, produces a left channel output signal by combining the difference signal (L−R) with the output signal of the second combiner 36, while the fourth combiner 38 produces a right channel output signal by combining the inverted difference signal (R−L) with the output signal of the second combiner 36.

Figure 4:
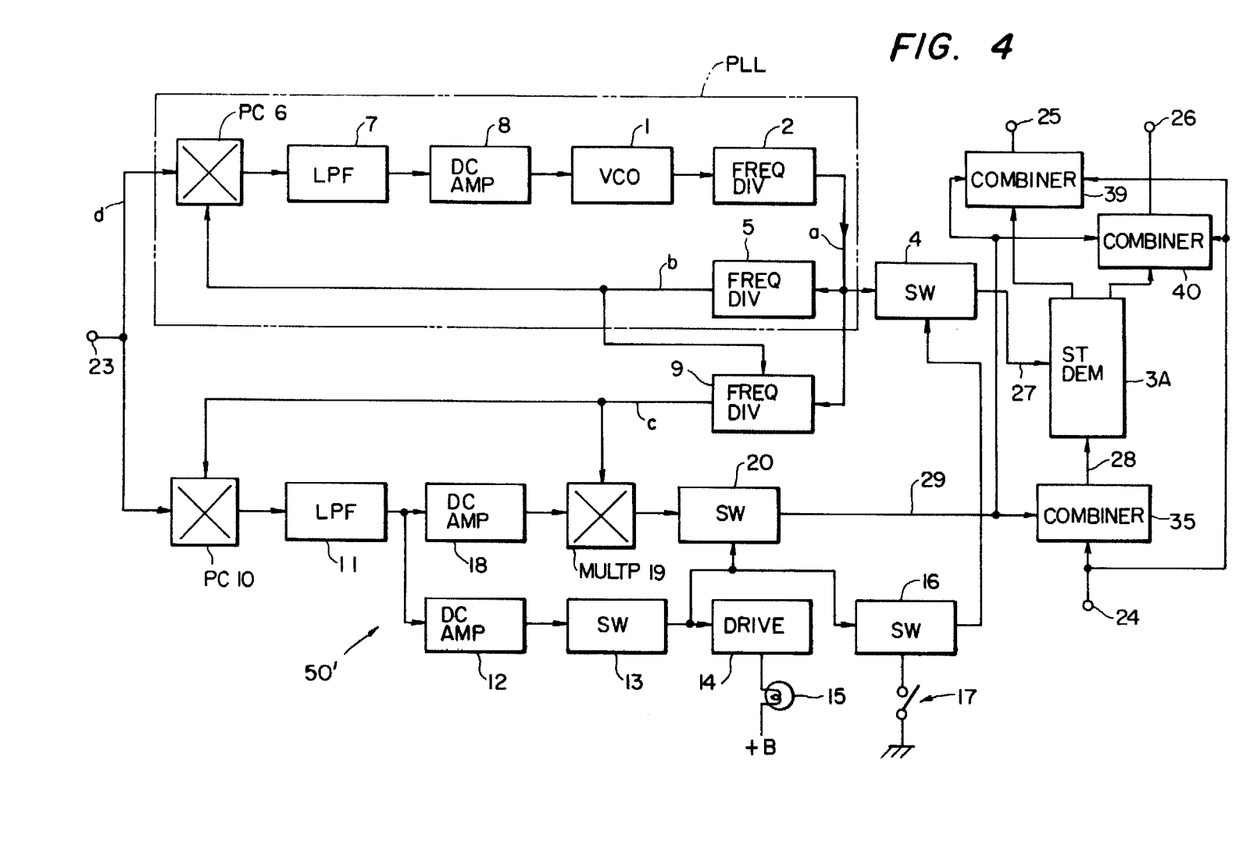
FIG. 4 is a schematic block diagram of another embodiment according to the present invention.

In FIG. 4 another embodiment of the stereo multiplex demodulator according to the present invention is illustrated, in which a first combiner 35 serves as the second and third combiners of FIG. 3, while a second combiner 40 serves as the second and fourth combiners of FIG. 3. Although only the stereo demodulator portion is shown in FIG. 3, a PLL, which functions as a stereo demodulating signal generator, and a cancelling signal generator 50' are also shown in FIG. 4. The stereo demodulator portion of FIG. 4 functions in the substantially same manner as that of FIG. 3.

The stereo demodulating signal applied via the conductor 27 to the stereo demodulator 3A may be produced by a suitable stereo demodulating signal genrator such as the PLL shown in FIG. 4. The stereo domodulating signal will be multiplied by the sub signal included in the composite stereo signal in the stereo demodulator 3A so that the difference signal (L−R) and the inverted difference signal (R−L) are respectively produced as the result of the multiplication. To this end the stereo demodulating signal has a predetermined frequency, a phase and a duty cycle.

The pilot signal cancelling signal applied via the conductor 29 is produced from a D.C. signal having an amplitude proportional to the amplitude of the pilot signal, where the D.C. signal is produced by the synchronous detection of the pilot signal, and a symmetrical wave signal synchronous with the pilot signal and having a predetermined phase relationship with respect to the pilot signal. Accordingly, the D.C. signal has an amplitude proportional to that of the pilot signal, a frequency the same as the fundamental frequency of the pilot signal and a phase synchronous with the pilot signal.

Although the D.C. signal having an amplitude propotioanl to that of the pilot signal, which D.C. signal is required for producing the cancelling signal, may be readily obtained by the synchronous detection of the pilot signal in the same manner as shown in FIG. 1, the method and means for producing this D.C. signal is not limited to this example of FIG. 1. Namely, any type of circuitry may be used if the D.C. signal is produced by the synchronous detection of the pilot signal. Therefore, the synchronous signal, i.e. a sampling signal, used for the synchronous detection may be of any type as long as it is synchronous with the pilot signal although a square wave signal having the same or opposite phase with respect to the pilot signal, and a duty cycle of 50 percent is used in the conventional system of FIG. 1. For instance, the phase of the synchronous signal may be deviated from that of the above mentioned square wave signal, and furthermore, a three-level signal may be used as the synchronous signal.

The level of the pilot signal is prescribed such that it corresponds to from 8 to 10 percent in terms of modulation degree on the condition that the modulation degree of 100 percent corresponds to the frequency deviation of 75 KHz. This level of the pilot signal may vary between the above mentioned range throughout various broadcast stations. However, the amplitude of the cancelling signal also varies in accordance with the variation of the amplitude of the pilot signal so that the cancellation of the pilot signal is effectively performed at all times.

There are two methods for producing the cancelling signal which has an amplitude proportional to that of the pilot signal, a phase the same as or opposite to that of the pilot signal and a frequency synchronous with the pilot signal. The first method is such that a D.C. signal having an amplitude proportional to that of the pilot signal is multiplied by a symmetrical square wave having the same or opposite phase with respect to that of the pilot signal and a frequency synchronous with the pilot signal to obtain a result of the multiplication, and this resultant signal is used as the cancelling signal. In the embodiment illustrated in FIG. 4 this method for producing the cancelling signal is adopted. The second method is that adopted in the conventional system of FIG. 1. Namely, the D.C. signal having an amplitude proportional to that of the pilot signal is multiplied by a symmetrical square wave signal synchronous with the pilot signal and having a phase difference of +90 degrees or −90 degrees with respect to the pilot signal, and the resultant output signal is then integrated to produce the cancelling signal.

The symmetrical square wave signal by which the D.C. signal having an amplitude proportional to that of the pilot signal, which symmetrical square wave signal is required in the above mentioned first and second methods, may be readily derived from the stereo demodulating signal generator, such as the PLL of FIG. 1 or 4. Although the waveform of the product signal obtained as the result of the multiplication is similar to the waveform of the symmetrical square wave signal, the above mentioned cancelling signal obtained by integrating the product signal in the second method becomes such that the harmonic components are reduced by the integration. As to the method of integration, for example, a suitable capacitor may be employed for charging and discharging with the product signal so that the voltage across the capacitor equals the integrated value.

The cancelling signal obtained in this way has an amplitude proportional to that of the pilot signal by a given factor and has the same or opposite phase with respect to the pilot signal, and this cancelling signal includes given harmonic components in accordance with the above mentioned symmetrical square wave.

The operation of the stereo demodulator portion of FIG. 3 will be described hereinbelow. The demodulator portion is supplied with the composite stereo signal C(t) at the input terminal 24, which composite stereo signal C(t) is given by the equation (2), while the stereo demodulator portion is further supplied with the stereo demodulating signal D'(t) via the conductor 27, and this stereo demodulating signal D''(t) is given as follows:

$$D'(t) = \pm M' \left( \sin 2\omega_p t + \tfrac{1}{3}\sin 6\omega_p t + \tfrac{1}{5}\sin 10\omega_p t + \ldots \right) \quad (13)$$

wherein M' is a constant corresponding to the gain of the demodulator 3A:

Furthermore, the stereo demodulator portion is supplied with the cancelling signal E(t) via the conductor 29 so that the stereo demodualtor portion produces left and right channel output signals at output terminals 25 and 26 which are respectively connected to the output terminals of the third and fourth combiners 37 and 38, where the pilot signal component, i.e. $\omega_p$ component is eliminated from the left and right channel output signals. Let us consider the operation of the demodulator 3A and the matrix of the demodulator portion paying attention to signal components of audio frequencies. The audio frequencies are not infulenced by the cancelling operation of the pilot signal and therefore, the operation of the first and second combiners 35 and 36 may be ignored with respect to the audio frequencies. The audio frequency components J(t) of the output signals of the demodulator 3A are expressed by the following equatiion (14):

$$J(t) = \pm \frac{M'}{2}(L - R) \quad (14)$$

Assuming that the combining ratio of the composite stereo signal applied from the input terminal 24 with the output signals of the stereo demodulator 3A in the third and fourth combiners 37 and 38 is expressed in terms of l (l may be either positive or negative), the audio frequency components of the output signals of the third and fourth combiners 37 and 38 are given by the follwing equation (15):

$$Q(t) = \pm \frac{M'}{2}(L - R) + l(L + R) \quad (15)$$

In this case, if the combining ratio l is seleted as:

$$l = \frac{M'}{2} \quad (16)$$

the audio frequency components Q(t) of the output signals of the third and fourth combiners 37 and 38 are given by the following equation (17):

$$Q(t) = M'.L \text{ or } Q(t) = M'.R \quad (17)$$

Therefore, if the stereo demodulator 3A delivers a signal component expressed in terms of {(M'/2) (L−R)} to the third combiner 37, and a signal component expressed in terms of {−(M'/2) (L−R)} to the fourth combiner 38, the left channel signal and the right channel signal are separated and thus are respectively developed at the output terminals 25 and 26. Accordingly, the demodulation with respect to audio frequencies is effected in the same manner as in the conventional stereo demodulator. Assuming that the combining ratio of the cancelling signal with the composite stereo signal in the first combiner 35 equals k as in the conventional system of FIG. 1, and the cancelling signal represented by the formula (5) is a triangular wave signal E(t), the output signal of the first combiner 35 equals S(t) which is given by equation (6).

The output signal of the stereo demodulator 3A is indicative of the product of the signal S(t) given by equation (6) and the stereo demodulating signal D'(t) given by equation (13), while the $\omega_p$ component included in the output signal of the stereo demodulator 3A, which $\omega_p$ component is expressed in terms of F'(t), is given by the following equation (18):

$$F'(t) = \quad (18)$$
$$\pm \frac{MP}{2}\left(1 + kN\left(1 - \frac{1}{3^2} + \frac{1}{3 \times 5^2} - \frac{1}{3 \times 7^2} + \ldots\right)\right)\cos\omega_p t$$

-continued $$= \pm \frac{M'P}{2}\left(1 + kN \sum_{n=1}^{\infty} \frac{8}{(4n-3)^2(4n-1)^2}\right)\cos\omega_p t$$

Accordingly, if the combining ratio k in the first combiner 35 is selected such that expressed by the following equation (19), F'(t) equals zero, namely, the output signal of the stereo demodulator 3A does not include $\omega_p$ components.

$$k = \frac{-1}{N \sum_{n=1}^{\infty} \frac{8}{(4n-3)^2(4n-1)^2}} \quad (19)$$

On the other hand, if we put the combining ratio of cancelling signal with the composite stereo signal as m, and further the output signal of the second combiner 36 as T(t), the following relationship is satisfied:

$$T(t) = C(t) + mE(t) \quad (20)$$

Nextly, if the $\omega_p$ component of the signal T(t) is expressed in terms of U(t), U(t) is given by the following equation (21):

$$U(t) = P(1 + mN) \sin \omega_p t \quad (21)$$

Therefore, if we select the combining ratio m in the second combiner 36 as expressed by the following equation (22), U(t) equals zero, namely, the output signal of the second combiner 36 does not include the $\omega_p$ component.

$$m = -(1/N) \quad (22)$$

In this way, if the combining ratios k and m in the first and second combiners 35 and 36 are respectively selected as represented by the equations (19) and (22), the input signals of the third and fourth combiners 37 and 38 do not include the $\omega_p$ components. Accordingly, the output signals of the third and fourth combiners 37 and 38 do not include the $\omega_p$ component. From the above, it will be understood that the $\omega_p$ component has been completely eliminated in theory from the output signals developed at the output terminals 25 and 26 of the stereo demodulator 3A when the method for cancelling pilot signal according to the present invention is adopted.

Reference is now made to FIG. 4 which shows a schematical block diagram of another embodiment of a stereo demodulator according to the present invention. As set forth hereinbefore, the circuitry of FIG. 4 comprises the PLL which functions as a stereo demodulating signal generator, a cancelling signal generator 50' and a stereo demodulator portion which is similar to the circuitry of FIG. 3. In FIG. 4, elements and circuits corresponding to those of FIG. 1 or FIG. 3 are designated by like numerals. The construction of the PLL is the same as that of FIG. 1, while the cancelling signal generator 50' differs from that of FIG. 1 in that the integrator 21 is omitted and the multiplier 19 is responsive to the output signal of the third frequency divider 9. The stereo multiplex demodulator of FIG. 4 operates as follows:

A D.C. signal, the amplitude of which is proportional to that of the pilot signal, is generated by a synchronous detector which consists of a phase comparator or detector 10 and a low pass filter 11, and this D.C. signal is amplified by a first D.C. amplifier so that an amplified D.C. signal is then applied to an input terminal of a multiplier 41. The phase comparator 10 is supplied with a synchronous signal derived from a divided-by-two frequency divider 9. In the multiplier 41, the above mentioned D.C. signal is multiplied by the output signal of the divided-by-two frequency divider 9. This output signal of the frequency divider 9 is illustrated in FIG. 2 and is designated as "c". This signal "c" has the same or opposite phase with respect to the pilot signal "d", the waveform of which is also illustrated in FIG. 2, and a frequency synchronous with the pilot signal "d". In detail, this signal "c" is a square wave signal of 19 KHz having a duty cycle of 50 percent. The output product signal of the multiplier 41, which product signal is obtained as the result of the multiplication, has an amplitude proportional to that of the pilot signal, a frequency the same as that of the pilot signal and takes the form of a square wave signal having a duty cycle of 50 percent and the same or opposite phase with respect to the pilot signal "d". This signal "c" is then fed via a switch 20 and a conductor 29 to the stereo demodulator portion as a cancelling signal E'(t).

The above mentioned cancelling signal is given by the following equation (23):

$$E'(t) = PN' (\sin\omega_p t + \frac{1}{3}\sin 3\omega_p t + 1/5 \sin 5\omega_p t + \ldots) \quad (23)$$

wherein N' is a factor of proportionality and is defined by the coefficient of the synchronous detection, the gain of the D.C. amplifier 18, the gain of the multiplier 41 and the like:

The stereo demodulator portion is supplied with the stereo demodulating signal D'(t) via the conductor 27, while the input terminal 24 of the stereo demodulator portion is supplied with the composite stereo signal C(t), and these signals D'(t) and C(t) are respectively given by the beforementioned formulas (13) and (2).

In FIG. 4, the combiner 35 produces an output signal S'(t) expressed by the following equation (24), and this output signal is then applied to the stereo demodulator 3A via a conductor 28.

$$S'(t) = C(t) + kE'(t) \quad (24)$$

The stereo demodulator 3A is responsive to the signal S'(t) applied via the conductor 28 and to the stereo demodulating signal D'(t) applied via the conductor 27, and thus the former signal S'(t) is multiplied by the latter signal D'(t). The $\omega_p$ component, which is expressed in terms of V(t), of the output signal of the stereo demodulator 3A is given by the following equation (25):

$$V(t) = \pm \frac{M'P}{2}\left(1 + kN'\left(1 + \frac{1}{3} + \frac{1}{3 \times 5} + \frac{1}{3 \times 7} + \ldots\right)\right)\cos\omega_p t$$

$$= \pm \frac{M'P}{2}\left(1 + kN' \sum_{n=1}^{\infty} \frac{4}{(4n-3)(4n-1)}\right)\cos\omega_p t \quad (25)$$

Let us suppose that the combining ratio k of the cancelling signal with the composite stereo signal in the combiner 35 is selected as expressed by equation (26):

$$k = \frac{-1}{N' \sum_{n=1}^{\infty} \frac{4}{(4n-3)(4n-1)}} \quad (26)$$

At this time, the $\omega_p$ component, i.e. V(t), included in the output signal of the stereo demodulator 3A equals zero, namely, this means that the $\omega_p$ component of the output signal of the stereo demodulator 3A has been completely eliminated.

As described hereinabove, the combiner 39 of FIG. 4 serves as the second and third combiners 36 and 37 of FIG. 3, while the combiner 40 serves as the second and fourth combiners 36 and 38 of FIG. 3. In detail, the combiner 39 is supplied with three signals, viz. the composite stereo signal, the cancelling signal and one of the output signals of the stereo demodulator 3A, while the combiner 40 is supplied with three signals, viz. the composite stereo signal, the cancelling signal and the other output signal of the stereo demodulator 3A.

The above mentioned three signals applied to the combiner 39 are combined by a predetermined ratio, while the other three signals applied to the combiner 40 are combined by a predetermined ratio. If the combining ratio of the cancelling signal with the composite stereo signal in the combiners 39 and 40 is made equal to the combining ratio of the cancelling signal with the composite stereo signal in the second combiner 36 of FIG. 3, the combining function of the cancelling signal with the composite stereo signal in the system of FIG. 4 is equivalent to that in the system of FIG. 3. In the same manner, the combining ratio with respect to the output signals of the stereo demodulator 3A in the combiners 39 and 40 may be set equal to those of third and fourth combiners 37 and 38 of FIG. 3 so that matrixing of the difference signal (L−R) and the inverted difference signal (R−L) with the composite stereo signal is performed in the same manner as is the stereo demodulator portion of FIG. 3. Therefore, if the combining ratio m' of the cancelling signal with the composite stereo signal in the combiners 39 and 40 is selected as expressed by the following equation (27), perfect elimination of the $\omega_p$ component from the signals used to be combined with the output signals of the stereo demodulator 3A, is achieved.

$$m' = -(1/N') \quad (27)$$

From the above it will be understood that output signals including no $\omega_p$ component are developed at the output terminals 25 and 26 of the stereo demodulator portion when the combining ratios in the respective combiners 35, 39 and 40 are set as defined by the equations (26) and (27).

From the foregoing description of two embodiments, it will be understood that the cancellation of the pilot signal is effected by using any type of cancelling signal and stereo demodulating signal according to the present invention. Namely, by setting the combining ratios in the combiners at suitable values, the $\omega_p$ component can be perfectly eliminated from the output signals no matter what kind of combination of the cancelling signal and the dumodulating signal is used. Therefore, the present invention is not limited to the above described embodiments, and thus the stereo demodulating signal may be a three-level or four-level pulse signal, while the cancelling signal may be a trapezoid wave signal or a multilevel, such as three-level or four level, pulse signal.

In the above, although it has been described that the degree of the cancellation of the pilot signal may be adjusted by varying or adjusting the combining ratios in the combiners, the combining ratios are not necessarily adjustable. Namely, if the ratio of one combining ratio to the other combining ratio is predetermined, the combining ratios may be fixed at given values. In order to adjust the degree of the cancellation, the value of N or N' may be adjusted. In other words, the detection coefficient in the synchronous detector, the gain of the D.C. amplifier 18, the gain of the multiplier 41, i.e. the coversion coefficient, and/or the degree of coupling between these circuits may be adjusted for controlling the degree of the pilot signal cancellation.

What is claimed is:

1. A method of eliminating pilot signal components from stereo demodulated left and right channel signals by means of a pilot signal cancelling signal, said stereo demodulated left and right channel signals being obtained by matrixing a difference signal indicative of the difference between said left and right channel signals and an inverted difference signal which corresponds to an inverted signal of said difference signal, with respect to a composite stereo signal which includes said pilot signal, a main signal indicative of the sum of said left and right channel signals, and a sub signal indicative of the difference between said left and right channel signals, said difference signal and said inverted difference signal are respectively obtained by multiplying said composite stereo signal by a stereo demodulating signal, comprising the steps of:

(a) combining said pilot signal cancelling signal with said composite stereo signal by a first predetermined ratio for producing a first combined composite stereo signal, said first combined composite stereo signal being used to produce said difference signal and said inverted difference signal; and (b) combining said pilot signal cancelling signal with said composite stereo signal by a second predetermined ratio for producing a second combined composite stereo signal, said second combined composite stereo signal being used for matrixing said difference signal and said inverted difference signal for producing said left and right channel signals.

2. A method of eliminating pilot signal components as claimed in claim 1, wherein said first ratio is determined by the ratio of harmonics included in said cancelling signal to harmonics included in said stereo demodulating signal.

3. A method of eliminating pilot signal components as claimed in claim 1, wherein said second ratio is determined such that the fundamental frequency component of said pilot signal included in said composite stereo signal is cancelled by the fundamental frequency component of said cancelling signal.

4. A stereo multiplex demodulator for producing left and right channel output signals from a composite stereo signal which includes a pilot signal, a main signal indicative of the sum of said left and right channel signals, and a sub signal indicative of the difference between said left and right channel signals, comprising:

(a) a stereo demodulating signal generator for producing a stereo demodulating signal the frequency of which equals twice the frequency of said pilot signal;

(b) a pilot signal cancelling signal generator for producing a pilot signal cancelling signal having an amplitude proportional to the amplitude of said pilot signal, a frequency synchronous with said pilot signal, and a phase the same or opposite with respect to the phase of said pilot signal;

(c) first means for combining said composite stereo signal with said cancelling signal by a first predetermined ratio for producing a first combined composite stereo signal;

(d) a stereo demodulator responsive to said first combined composite stereo signal and to said stereo demodulating signal for producing a difference signal indicative of the difference between said left and right channel signals and an inverted difference signal corresponding to an inverted signal of said difference signal;

(e) second means for combining said composite stereo signal with said cancelling signal by a second predetermined ratio for producing a second combined composite stereo signal;

(f) third means for combining said second combined composite stereo signal with said difference signal for producing said left channel signal; and (g) fourth means for combining said second combined composite stereo signal with said inverted difference signal for producing said right channel signal.

5. A stereo multiplex demodulator as claimed in claim 4, wherein said second means and said third means are incorporated into a single combiner, while said second and fourth means are incorporated into another single combiner.

6. A stereo multiplex demodulator as claimed in claim 4, wherein said stereo demodulating signal generator comprises a phase locked loop responsive to said pilot signal.

7. A stereo multiplex demodulator as claimed in claim 6, wherein said phase locked loop comprises:

(a) an oscillator the oscillation frequency of which controllable;

(b) a first frequency divider for dividing the output frequency of said oscillator;

(c) a second frequency divider for dividing the output frequency of said first frequency divider;

(d) a phase comparator responsive to said composite stereo signal and to an output signal of said second frequency divider for producing an output signal indicative of the phase difference between its two input signals;

(e) a low pass filter for passing a low frequency component of the output signal of said phase comparator; and (f) a D.C. amplifier responsive to the output signal of said low pass filter to produce an output signal which is then fed to an input terminal of said oscillator to control the oscillation frequency thereof.

8. A stereo multiplex demodulator as claimed in claim 7, wherein said pilot signal cancelling signal generator comprises:

(a) a third frequency divider for dividing the output frequency of said first frequency divider in synchronization with the output frequency of said second frequency divider;

(b) a phase comparator responsive to said composite stereo signal and to an output signal of said third frequency divider for producing an output signal indicative of the phase difference between its two input signals;

(c) a low pass filter for passing a low frequency component of the output signal of said phase comparator;

(d) a D.C. amplifier responsive to the output signal of said low pass filter to produce an output signal; and (e) a multiplier for multiplying the output signal of said D.C. amplifier by the output signal of said third frequency divider for producing a product signal.

9. A stereo multiplex demodulator as claimed in claim 4, further comprising a stereo-disable switch interposed between said stereo demodulating signal generator and said stereo demodulator.

* * * * *